US007203876B2

United States Patent
Allen et al.

(10) Patent No.: US 7,203,876 B2
(45) Date of Patent: Apr. 10, 2007

(54) METHOD AND APPARATUS FOR CONTROLLING AC POWER DURING SCAN OPERATIONS IN SCANNABLE LATCHES

(75) Inventors: David Howard Allen, Rochester, MN (US); William Paul Hovis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 242 days.

(21) Appl. No.: 11/000,435

(22) Filed: Nov. 30, 2004

(65) Prior Publication Data

US 2006/0156116 A1   Jul. 13, 2006

(51) Int. Cl.
G01R 31/28   (2006.01)
(52) U.S. Cl. ............ 714/726; 714/30; 326/16; 365/154; 327/202
(58) Field of Classification Search ............ None
See application file for complete search history.

(56) References Cited

U.S. PATENT DOCUMENTS 5,719,876 A * 2/1998 Warren .................. 714/718
5,838,693 A * 11/1998 Morley .................. 714/726
5,907,562 A * 5/1999 Wrape et al. ............ 714/726
6,853,212 B2 * 2/2005 Chandar et al. .......... 326/16

* cited by examiner

*Primary Examiner*—Albert Decady
*Assistant Examiner*—John P. Trimmings
(74) *Attorney, Agent, or Firm*—Joan Pennington

(57) ABSTRACT

A method and apparatus are provided for implementing AC power dissipation control during scan operations in scannable latch designs. A scannable latch has a functional data output and a scan data output. A switching control is provided with the functional data output. The switching control is driven to prevent switching of the functional data output during at least part of the scan operations. Then the switching control is disabled enabling switching of the functional data output during functional data operations.

9 Claims, 5 Drawing Sheets

PRIOR ART

METHOD AND APPARATUS FOR CONTROLLING AC POWER DURING SCAN OPERATIONS IN SCANNABLE LATCHES

FIELD OF THE INVENTION

The present invention relates generally to the field of integrated circuits, and more particularly, relates to a method and apparatus for implementing AC power dissipation control during scan operations in scannable latch designs.

DESCRIPTION OF THE RELATED ART

Scannable latches are used in manufacturing test and lab debug functions. Each scannable latch is part of both the functional logic and part of a scan chain and therefore can load data from two inputs, a functional data input and a scan data input, as shown in FIG. 1. Typically both the scan path and the functional paths share a common data output of the latch as shown in FIG. 2A, while a separately-buffered scan data output can be provided to improve performance by reducing the capacitive load on the functional path as shown in FIG. 2B.

When using scannable latches during functional operation, data is launched from the common data output or dedicated functional data output of the source latch, propagates through functional logic, and then is captured through the functional data input of the destination latch.

During scan operation, scan data propagates between latches in the scan chain, launching from the common data output or dedicated scan data output of a scan source latch and captured by the scan destination latch though the scan data input. As data is scanned through the scan latch chain, the common data output or the dedicated scan data output of the latch switches as scan data propagates through the scan chain, and the common data output or the dedicated functional data output changing state creates switching in the functional logic.

The scan operation therefore causes unnecessary switching in the functional logic, which creates AC power dissipation. Moreover, the data in the scan chain can cause significantly higher switching factors in the latches than during functional operation, so at the same frequency, AC power dissipation during scan operation can be significantly higher than in functional mode.

Limitations in power delivery or cooling may limit the frequency at which scan can be performed, particularly at wafer test where multiple die are often probed and tested in parallel to reduce test time. The inability to scan at speed, that is, at the clock frequency of the chip during functional operation in the system, impacts the ability to detect AC faults, since AC testing is often performed by switching between scan and functional operation on a cycle precise or at-speed basis.

FIGS. 2A and 2B illustrate prior art scannable latch designs. Both latches consist of a master L1 and slave L2 latch. Separate functional data input, DATA_IN and scan data input, SCAN_DATA_IN are required. In FIG. 2A, a single common data output, DATA_OUT supplies data to both the logic in the functional data path and the scan data input of the next scannable latch in the scan chain. In FIG. 2B, a separate scan data output, SCAN_DATA_OUT is provided to avoid loading the functional path with the additional interconnect and gate capacitance required to connect to the next scannable latch in the scan path. In either of these prior art scannable latch designs, the functional data output DATA_OUT will switch when the data latched at node L2 changes. This switching during scan operation generates the undesirable AC power.

A need exists for an effective mechanism for implementing AC power dissipation control during scan operations in scannable latch designs.

SUMMARY OF THE INVENTION

Principal aspects of the present invention are to provide a method and apparatus for implementing AC power dissipation control during scan operations in scannable latch designs. Other important aspects of the present invention are to provide such method and apparatus for implementing AC power dissipation control during scan operations substantially without negative effect and that overcome many of the disadvantages of prior art arrangements.

In brief, a method and apparatus are provided for implementing AC power dissipation control during scan operations in scannable latch designs. A scannable latch has a functional data output and a scan data output. A switching control is provided with the functional data output. The switching control is driven to prevent switching of the functional data output during at least part of the scan operations. Then the switching control is disabled during functional data operations.

In accordance with feature of the invention, an additional signal is provided to drive and disable the switching control. The switching control includes a pair of transistors added to convert a functional data output inverter to a functional data output NAND gate.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a scannable latch apparatus is provided for reducing AC power during scan operation so that the frequency does not have to reduced due to power delivery or cooling limitations, as often required with large chips such as processors that are power limited. Reducing AC power can improve AC test coverage by allowing AC test to be run at full frequency, and reducing AC power can reduce test costs by allowing multiple chips to be tested simultaneously without overloading the tester power supply. The reduction of AC power is accomplished by gating the functional data output of a scannable latch during scan operation using a globally-distributed signal.

Figure 1:
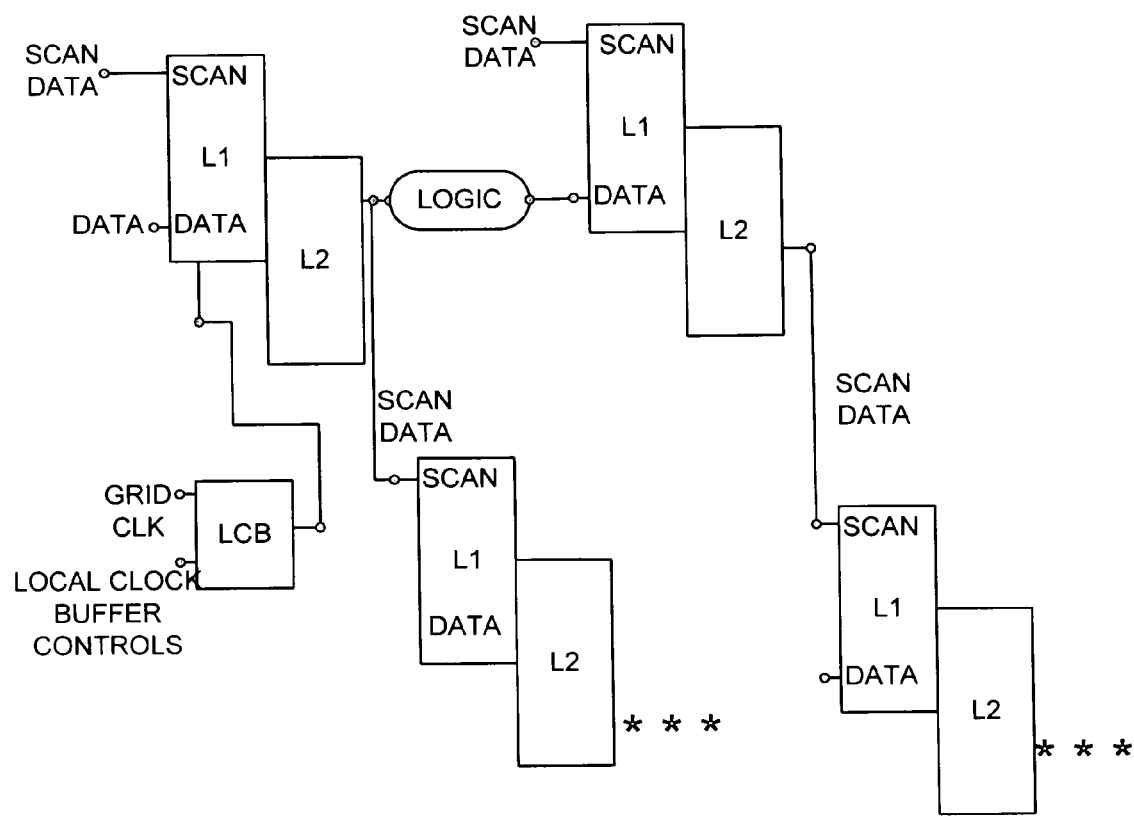
FIG. 1 is a block diagram representation illustrating a prior art scan chain arrangement of scannable latches.
Figure 2A:
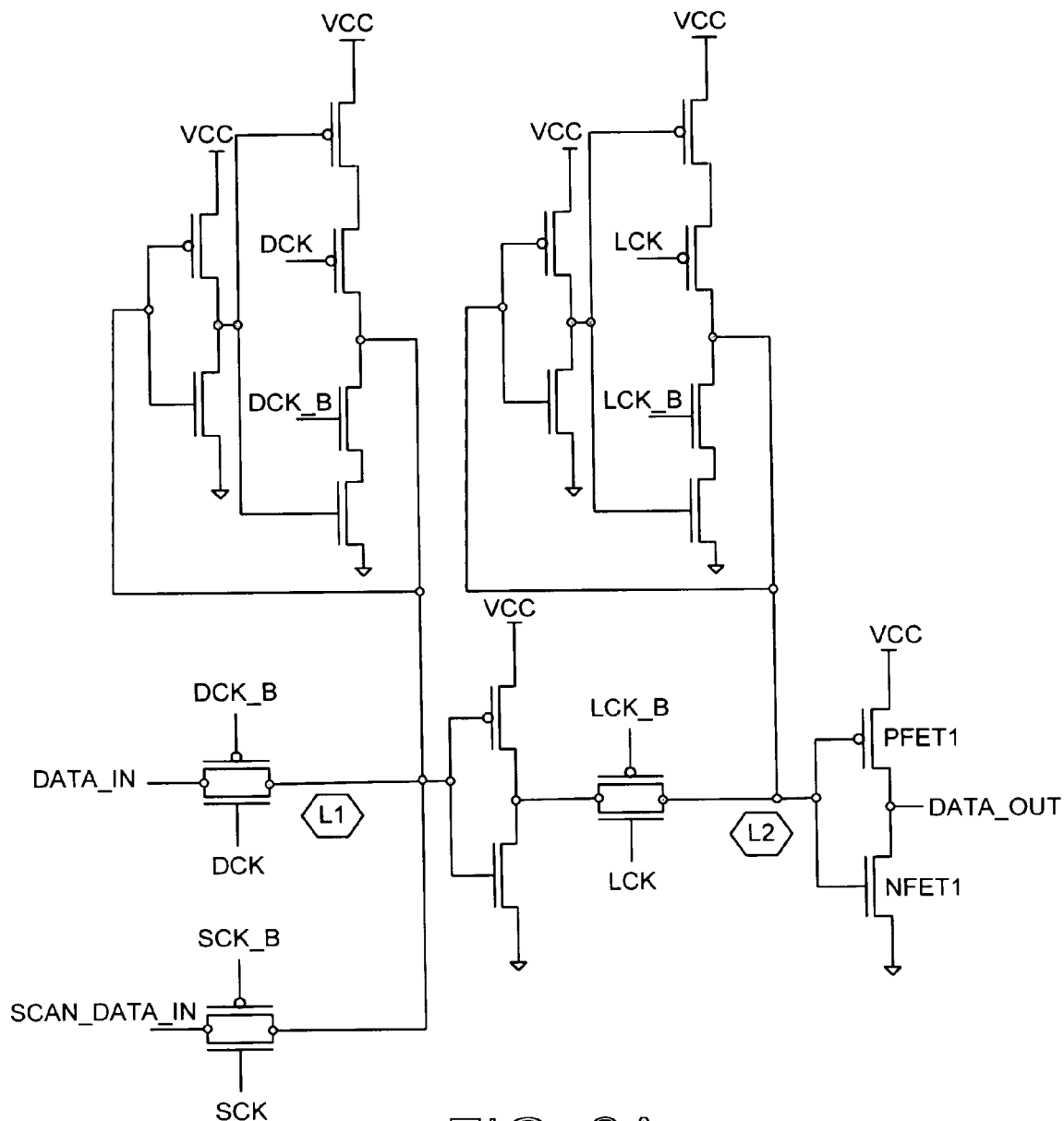
FIGS. 2A and 2B are schematic diagrams illustrating prior art scannable latch arrangements.
Figure 2B:
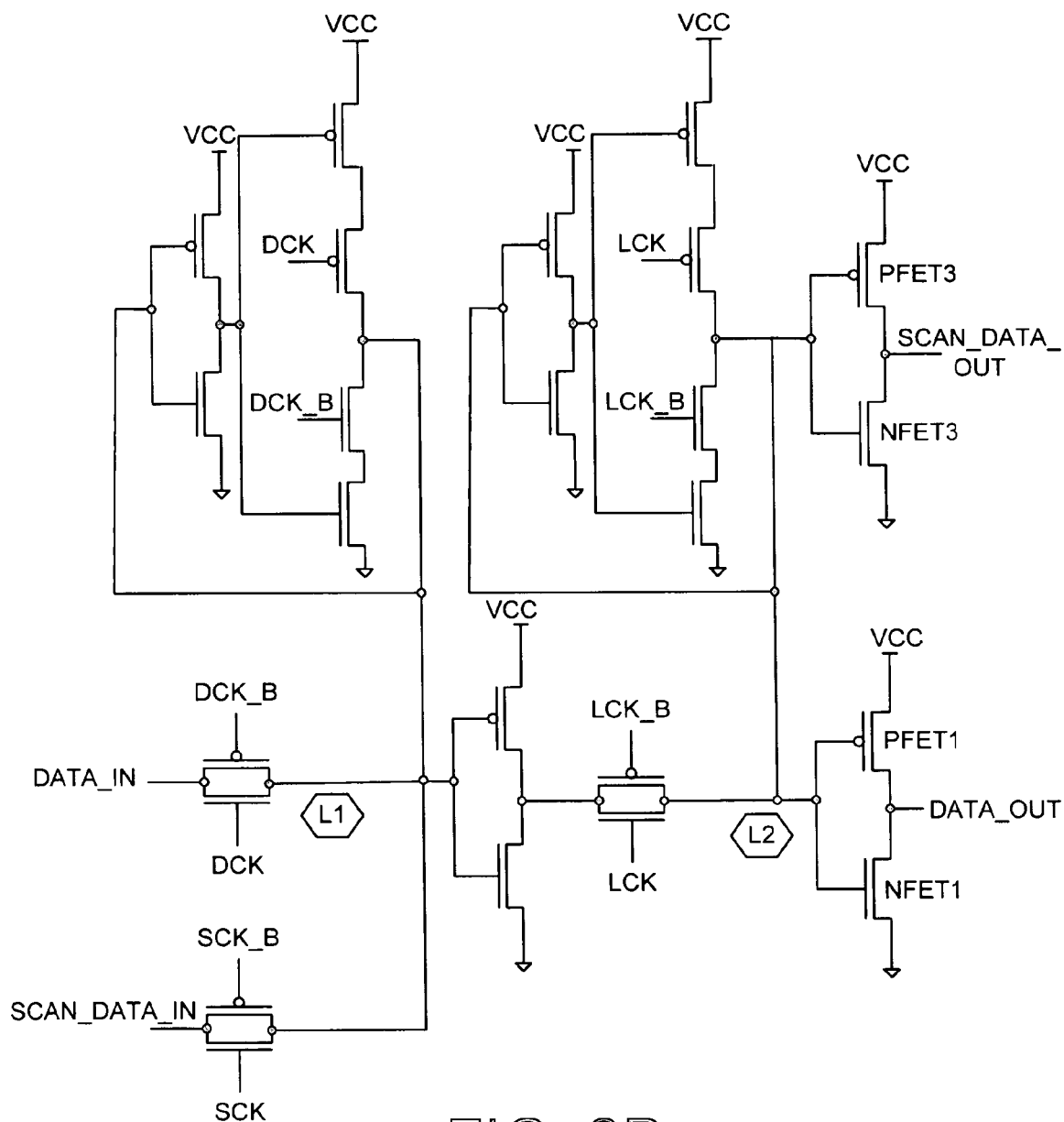
Figure 3:
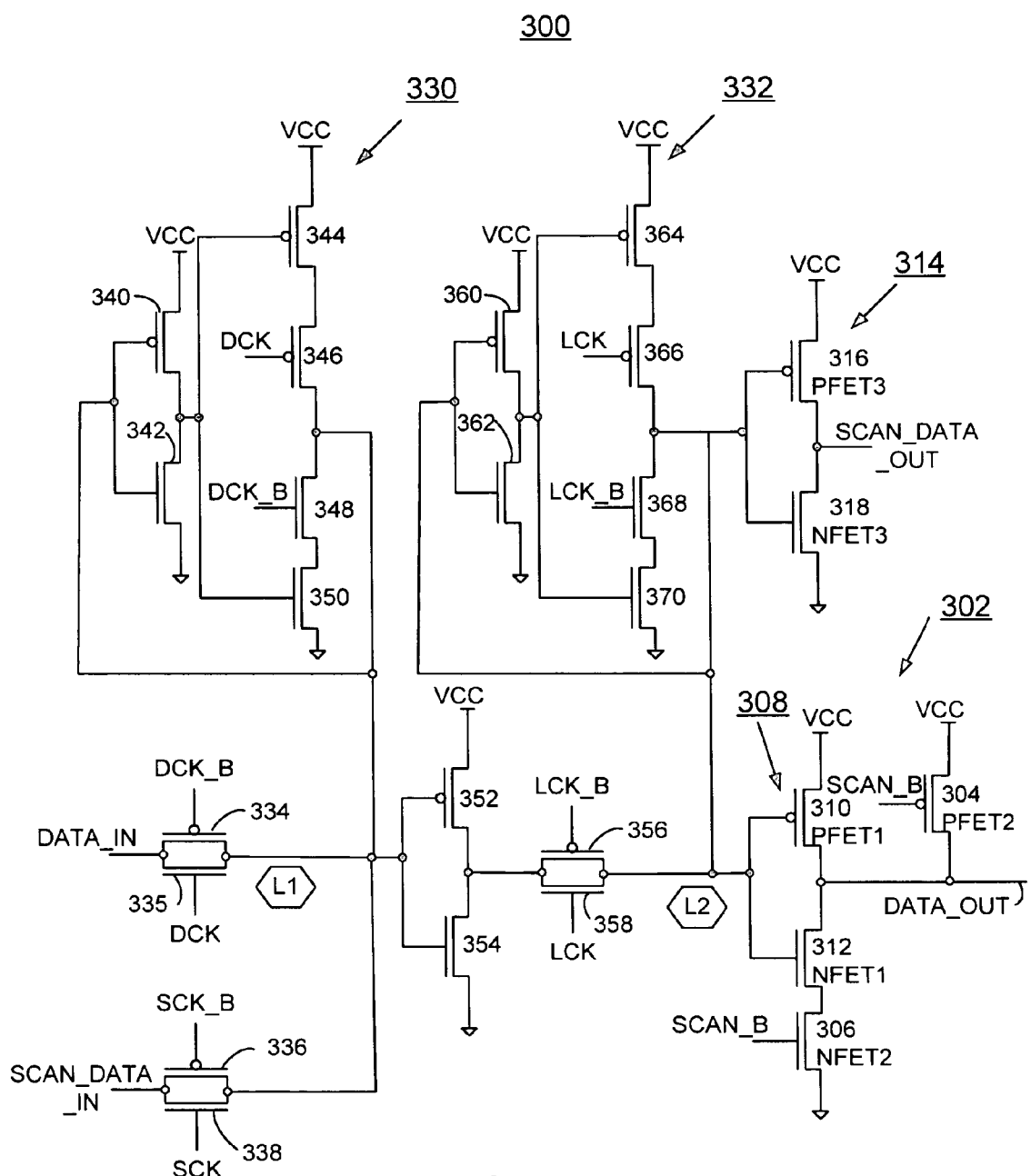
FIGS. 3 and 4 are schematic diagrams illustrating respective exemplary scannable latch apparatus for implementing AC power dissipation control during scan operations in the scannable latch designs in accordance with the preferred embodiments.

Referring now to the drawings, in FIG. 3 there is shown an exemplary scannable latch apparatus generally designated by the reference character 300 for implementing AC power dissipation control during scan operations in accordance with the preferred embodiment. A functional data output labeled DATA_OUT is maintained high during scan operations to prevent switching during the scan operation and the undesirable AC power of prior art scannable latch designs such as shown in FIGS. 2A and 2B.

A logical NAND gate generally designated by 302 is formed with a pair of additional field effect transistors (FETs) PFET2, 304, and NFET2, 306, have been introduced to convert a functional data output inverter designated by 308 to the logical NAND gate. Inverter 308 is defined by a pair of transistors PFET1, 310 and NFET 1, 312 connected in series between a voltage supply VCC and the added transistor NFET2, 306 of NAND gate 302. An additional signal SCAN_B has been introduced in scannable latch apparatus 300 to drive the gates of PFET2, 304, and NFET2, 306. A node labeled L2 provides a gate input to the data NAND gate PFET1, 310 and NFET 1, 312.

When the signal SCAN_B is high during a functional mode, NFET2, 306 is on and PFET2, 304 is off. Therefore the logical NAND gate 302 functions similarly to the original inverter 308 in buffering the latch node (L2) to the functional data output DATA_OUT.

When signal SCAN_B is low during a scan mode PFET2, 304 is on and NFET2, 306 is off, so regardless of the state of node L2, the functional data output DATA_OUT will remain high. This prevents any switching of the functional data in scan mode so that the functional data output DATA_OUT will be quiet, that is, always high during scan operation.

During AC test, in which the latch apparatus 300 must transition from scan mode to functional mode at frequency or cycle precise, the signal SCAN_B will be required to set up on the data NAND gate 302 prior to the launch of data from the L2 latch 332 that is, the transitions of latch clock LCK and LCK_B. Distributing an additional high-frequency signal around a large chip can be taxing on chip resources and schedule, but the signal SCAN_B need not be timed as a high-frequency signal. This is because the timing of SCAN_B is not critical. It exists only to reduce AC power which can cause thermal or power delivery issues, and both of these are long term effects when compared to the cycle time of most chips. Therefore, SCAN_B need only be asserted some time after the chip transitions from functional to scan mode, and it must be de-asserted some time before the chip transitions from scan to functional mode, that is, for the first cycle of an AC test. During the time the chip is in scan mode but the signal SCAN_B is not valid, either entirely or partially across the chip, additional AC power will be generated due to switching of the DATA_OUT during scanning, but as long as this is restricted to no longer than a fraction of the thermal time constant or the power delivery time constant, typically microseconds or longer, this short period of higher AC power should not create power delivery or thermal cooling problems at the tester.

Scannable latch apparatus 300 includes a separate scan output inverter generally designated 314 formed by a pair of transistors PFET3, 316 and NFET3, 318 connected in series between the voltage supply VCC and ground. Node L2 provides a gate input of PFET3, 316 and NFET3, 318 that provide the scan output labeled SCAN_DATA_OUTPUT at the output of inverter 314.

Scannable latch apparatus 300 includes a conventional master latch L1 generally designated by 330, and a conventional slave latch L2 generally designated by 332. A data input labeled DATA_IN is coupled by a respective one of a pair of transistors PFET 334, and NFET 335 to an input inverter of the master latch L1, 330. The transistors PFET 334, and NFET 335 are respectively gated by data clock DCK_B and DCK. A scan data input labeled SCAN_DATA_IN is coupled by a respective one of a pair of transistors PFET 336, and NFET 338 to the input inverter of the master latch L1, 330. The transistors PFET 336, and NFET 338 are respectively gated by scan clock SCK_B and SCK. The input inverter of the master latch L1, 330 is defined by PFET 340 and NFET 342 connected in series between the voltage supply VCC and ground. Master latch L1, 330 includes a transistor stack of a pair of series connected PFETs 344, 346 and a pair of series connected NFETs 348, 350 connected in series between the voltage supply VCC and ground. An output of the input inverter of the master latch L1, 330 at a connection of PFET 340 and NFET 342 is connected to a gate input of PFET 344 and NFET 350. The transistors PFET 346, and NFET 348 are respectively gated by data clock DCK and DCK_B. A master latch L1, 330 output at a connection of PFET 346 and NFET 348 is connected to a gate input of a pair of series connected transistors PFET 352 and NFET 354. The inverted master latch L1 output of PFET 352 and NFET 354 is coupled by a respective one of a pair of transistors PFET 356, and NFET 358 to the input inverter of the slave latch L2, 332. The transistors PFET 356 and NFET 358 are respectively gated by latch clock LCK_B and LCK. Slave latch L2, 332 includes an input inverter defined by PFET 360 and NFET 362 connected in series between the voltage supply VCC and ground. Slave latch L2, 332 includes a transistor stack of a pair of series connected PFETs 364, 366 and a pair of series connected NFETs 368, 370 connected in series between the voltage supply VCC and ground. An output of the input inverter of the master latch L2, 332 at a connection of PFET 360 and NFET 362 is connected to a gate input of PFET 364 and NFET 370. The transistors PFET 366 and NFET 368 are respectively gated by latch clock LCK and LCK_B. A slave latch L2, 332 output at a connection of PFET 366 and NFET 368 is connected to a gate input of the scan data output inverter PFET3, 316 and NFET3, 318 and to a gate input of the NAND gate PFET1, 310 and NFET1, 312.

Figure 4:
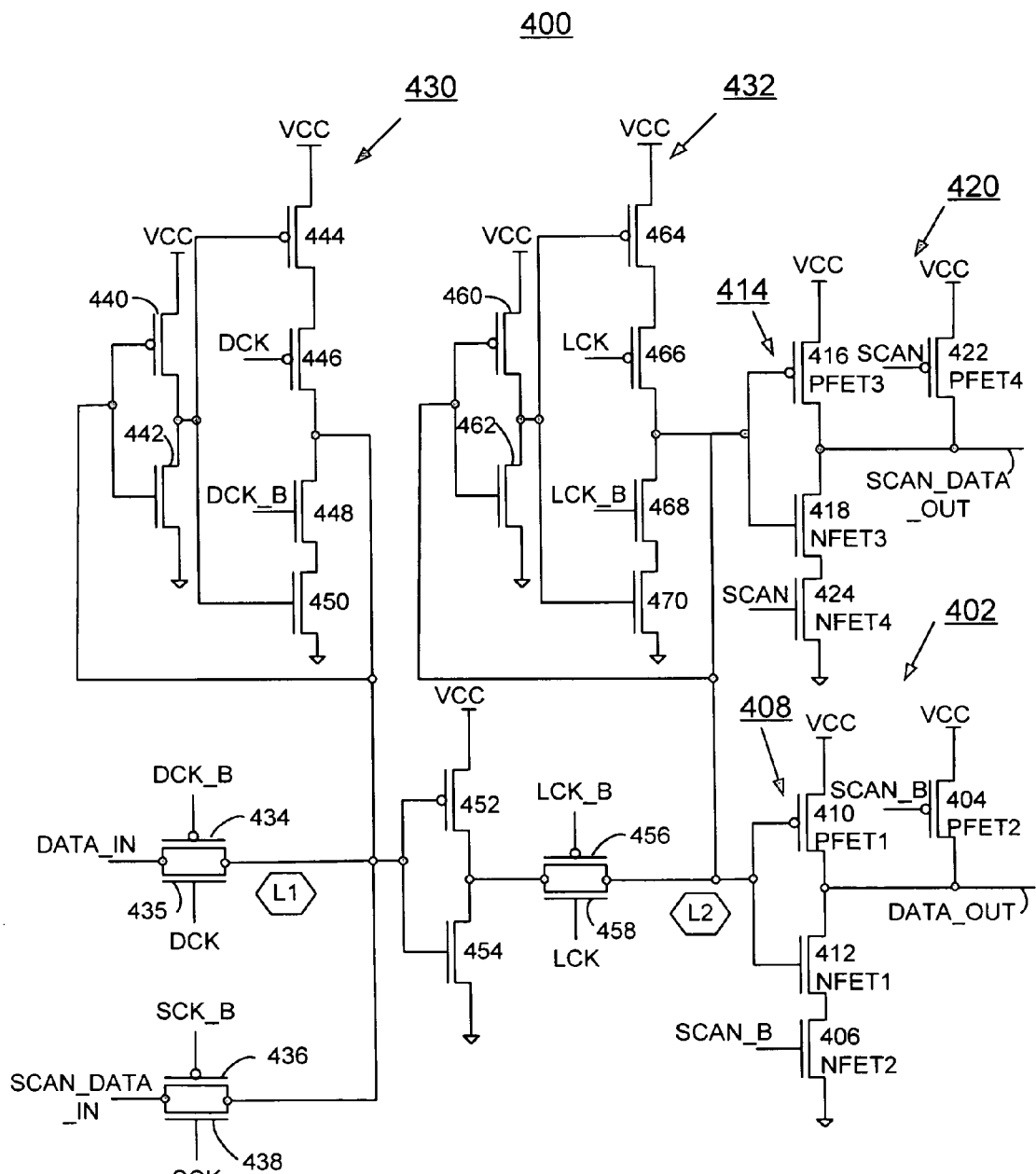

Referring now to FIG. 4, there is shown another exemplary scannable latch apparatus generally designated by the reference character 400 for implementing AC power dissipation control during scan operations in accordance with the preferred embodiment. A functional data output labeled DATA_OUT is maintained high during scan operations to prevent switching during the scan operation and the undesirable AC power of prior art scannable latch designs such as shown in FIGS. 2A and 2B.

A logical NAND gate generally designated by 402 is formed with a pair of additional field effect transistors (FETs) PFET2, 404, and NFET2, 406, have been introduced to convert a functional data output inverter designated by 408 to the logical NAND gate. Inverter 408 is defined by a pair of transistors PFET1, 410 and NFET 1, 412 connected in series between a voltage supply VCC and the added transistor NFET2, 406 of NAND gate 402. An additional signal SCAN_B has been introduced in scannable latch apparatus 400 to drive the gates of PFET2, 404, and NFET2, 406. A node labeled L2 provides a gate input to PFET1, 410 and NFET 1, 412.

Logical NAND gate 402 provides similar functions as NAND gate 302 of scannable latch apparatus 300 of FIG. 3. When the signal SCAN_B is high during a functional mode, NFET2, 406 is on and PFET2, 404 is off. Therefore the logical NAND gate 402 functions similarly to the original inverter 408 in buffering the latch node (L2) to the functional data output DATA_OUT. When signal SCAN_B is low during a scan mode PFET2, 404 is on and NFET2, 406 is off, so regardless of the state of node L2, the functional data output DATA_OUT will remain high. This prevents any switching of the functional data in scan mode so that the functional data output DATA_OUT will be quiet, that is, always high during scan operation.

A scan data logical NAND gate generally designated by 420 is formed with a pair of additional field effect transistors (FETs) PFET4, 422, and NFET4, 424, have been introduced to convert a scan data output inverter designated by 414 to the logical NAND gate. Inverter 414 is defined by a pair of transistors PFET3, 416 and NFET3, 418 connected in series between a voltage supply VCC and the added transistor NFET4, 424 of NAND gate 420. An additional signal SCAN has been introduced in scannable latch apparatus 400 to drive the gates of PFET4, 422, and NFET4, 424. The node L2 provides a gate input to the scan data NAND PFET3, 416 and NFET3, 418.

When the signal SCAN is high during a scan mode, NFET4, 424 is on and PFET4, 422 is off. Therefore the logical NAND gate 420 functions similarly to the original inverter 414 in buffering the latch node (L2) to the scan data output SCAN_DATA_OUT. When signal SCAN is low during a functional data mode PFET4, 422 is on and NFET4, 424 is off, so regardless of the state of node L2, the scan data output SCAN_DATA_OUT will remain high. This prevents any switching of the scan data in functional data mode so that the scan data output SCAN_DATA_OUT will be quiet, that is, always high during functional data operation.

Scan data logical NAND gate 420 provides the additional benefit of an AC power savings during functional mode since the scan chain is not switching during the functional data mode. However, this power savings is minimal as compared to the savings realized by not switching the functional data output during scan mode.

Scannable latch apparatus 400 includes a conventional master latch L1 generally designated by 430, and a conventional slave latch L2 generally designated by 432. A data input labeled DATA_IN is coupled by a respective one of a pair of transistors PFET 434, and NFET 435 to an input inverter of the master latch L1, 430. The transistors PFET 434, and NFET 435 are respectively gated by data clock DCK_B and DCK. A scan data input labeled SCAN_DATA_IN is coupled by a respective one of a pair of transistors PFET 436, and NFET 438 to the input inverter of the master latch L1, 430. The transistors PFET 436, and NFET 438 are respectively gated by scan clock SCK_B and SCK. The input inverter of the master latch L1, 430 is defined by PFET 440 and NFET 442 connected in series between the voltage supply VCC and ground. Master latch L1, 430 includes a transistor stack of a pair of series connected PFETs 444, 446 and a pair of series connected NFETs 448, 450 connected in series between the voltage supply VCC and ground. An output of the input inverter of the master latch L1, 430 at a connection of PFET 440 and NFET 442 is connected to a gate input of PFET 444 and NFET 450. The transistors PFET 446, and NFET 448 are respectively gated by data clock DCK and DCK_B. A master latch L1, 430 output at a connection of PFET 446 and NFET 448 is connected to a gate input of PFET 452 and NFET 454. The inverted master latch L1 output of PFET 452 and NFET 454 is coupled by a respective one of a pair of transistors PFET 456, and NFET 458 to the input inverter of the slave latch L2, 442. The transistors PFET 456, and NFET 458 are respectively gated by latch clock LCK_B and LCK. Slave latch L2, 432 includes an input inverter defined by PFET 460 and NFET 462 connected in series between the voltage supply VCC and ground. Slave latch L2, 432 includes a transistor stack of a pair of series connected PFETs 464, 466 and a pair of series connected NFETs 468, 470 connected in series between the voltage supply VCC and ground. An output of the input inverter of the master latch L2, 432 at a connection of PFET 460 and NFET 462 is connected to a gate input of PFET 464 and NFET 470. The transistors PFET 466, and NFET 468 are respectively gated by latch clock LCK and LCK_B. A slave latch L2, 432 output at a connection of PFET 466 and NFET 468 is connected to a gate input of the scan data output NAND gate PFET3 416 and NFET3 418 and to a gate input of the NAND gate PFET1, 410 and NFET1, 412.

While the present invention has been described with reference to the details of the embodiments of the invention shown in the drawing, these details are not intended to limit the scope of the invention as claimed in the appended claims.

What is claimed is:

1. A method for implementing AC power dissipation control during scan operations in scannable latch designs comprising the steps of:
   providing a scannable latch having a functional data output and a scan data output;
   providing a logical NAND gate coupled to said functional data output, said logical NAND gate a first P-channel field effect transistor (PFET) connected to a voltage supply and connected in series with a first N-channel field effect transistor (NFET) defining a functional data output inverter and a second NFET coupled between said functional data output inverter and ground; and a second PFET connected between the supply voltage and said functional data output of said inverter;
   providing a switching control with said functional data output applied to said logical NAND gate;
   driving said switching control to prevent switching of said functional data output during at least part of the scan operations; and
   disabling said switching control to enable switching of the functional data output during functional data operations.

2. The method for implementing AC power dissipation control as recited in claim 1 further includes the steps of:
   providing a second switching control with said scan data output;
   driving said second switching control to prevent switching of said scan data output during functional data operations; and
   disabling said second switching control to enable switching of the functional data output during scan data operations.

3. The method for implementing AC power dissipation control as recited in claim 2 wherein the step of providing a second switching control with said scan data output includes the step of providing a pair of transistors to convert a scan data output inverter to a logical NAND gate.

4. The method for implementing AC power dissipation control as recited in claim 2 wherein the step of providing a control signal SCAN for driving and disabling said second switching control.

5. Apparatus for implementing AC power dissipation control comprising:
   a scannable latch having a functional data output and a scan data output;
   a logical NAND gate coupled to said functional data output;

a switching control signal applied to said logical NAND gate to prevent switching of said functional data output during at least part of scan operations;

said switching control signal applied to said logical NAND gate to enable switching of the functional data output during functional data operations; and said logical NAND gate including a first P-channel field effect transistor (PFET) connected to a voltage supply and connected in series with a first N-channel field effect transistor (NFET) defining a functional data output inverter;

a second NFET coupled between said functional data output inverter and ground; and a second PFET connected between the supply voltage and the output of said functional data output inverter.

6. The apparatus for implementing AC power dissipation control as recited in claim 5 wherein said switching control signal is applied to a gate of said second NFET and a gate of said second PFET.

7. The apparatus for implementing AC power dissipation control as recited in claim 6 wherein said switching control signal is low during at least part of the scan operations, turning off said second NFET and turning on said second PFET to prevent switching of said functional data output during at least part of the scan operations.

8. The apparatus for implementing AC power dissipation control as recited in claim 6 wherein said switching control signal is high during the functional data operations, turning on said second NFET and turning off said second PFET to enable switching of the functional data output during the functional data operations.

9. The apparatus for implementing AC power dissipation control as recited in claim 5 further includes a second logical NAND gate coupled to said scan data output and a second control signal applied to said second logical NAND gate to prevent switching of said scan data output during functional data operations and to enable switching of the scan data output during scan data operations.

* * * * *